(12) United States Patent
Doris et al.

(10) Patent No.: US 8,629,504 B2
(45) Date of Patent: Jan. 14, 2014

(54) EXTREMELY THIN SEMICONDUCTOR-ON-INSULATOR (ETSOI) INTEGRATED CIRCUIT WITH ON-CHIP RESISTORS AND METHOD OF FORMING THE SAME

(75) Inventors: Bruce B. Doris, Brewster, NY (US);
Kangguo Cheng, Guilderland, NY (US);
Ali Khakifirooz, Slingerlands, NY (US);
Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 40 days.

(21) Appl. No.: 13/433,401

(22) Filed: Mar. 29, 2012

(65) Prior Publication Data
US 2012/0187493 A1    Jul. 26, 2012

Related U.S. Application Data

(62) Division of application No. 12/687,273, filed on Jan. 14, 2010.

(51) Int. Cl.
*H01L 21/00* (2006.01)

(52) U.S. Cl.
USPC ............ 257/350; 257/E27.112; 257/E21.704; 438/155

(58) Field of Classification Search
USPC ........... 257/350, E21.704, E27.112, 347, 358
See application file for complete search history.

(56) References Cited

U.S. PATENT DOCUMENTS

| | | |
|---|---|---|
| 5,930,638 A | 7/1999 | Reedy et al. |
| 6,873,015 B2 | 3/2005 | Bhattacharyya |
| 7,071,052 B2 | 7/2006 | Yeo et al. |
| 7,112,495 B2 | 9/2006 | Ko et al. |
| 7,148,544 B2 | 12/2006 | Bhattacharyya |
| 7,151,037 B2 | 12/2006 | Bhattacharyya |
| 7,190,028 B2 | 3/2007 | Bhattacharyya |
| 7,221,026 B2 | 5/2007 | Bhattacharyya |
| 7,291,878 B2 | 11/2007 | Stipe |
| 2006/0175659 A1 | 8/2006 | Sleight |
| 2007/0284654 A1 | 12/2007 | Rubino et al. |
| 2008/0217686 A1 | 9/2008 | Majumdar et al. |

OTHER PUBLICATIONS

Notice of Allowance dated Aug. 20, 2012 received in a related U.S. Patent Application, namely U.S. Appl. No. 12/687,273.

*Primary Examiner* — Eugene Lee
*Assistant Examiner* — Elias M Ullah
(74) *Attorney, Agent, or Firm* — Scully, Scott, Murphy & Presser, P.C.; H. Daniel Schnurmann

(57) ABSTRACT

An electrical device is provided that in one embodiment includes a semiconductor-on-insulator (SOI) substrate having a semiconductor layer with a thickness of less than 10 nm. A semiconductor device having a raised source region and a raised drain region of a single crystal semiconductor material of a first conductivity is present on a first surface of the semiconductor layer. A resistor composed of the single crystal semiconductor material of the first conductivity is present on a second surface of the semiconductor layer. A method of forming the aforementioned electrical device is also provided.

18 Claims, 4 Drawing Sheets

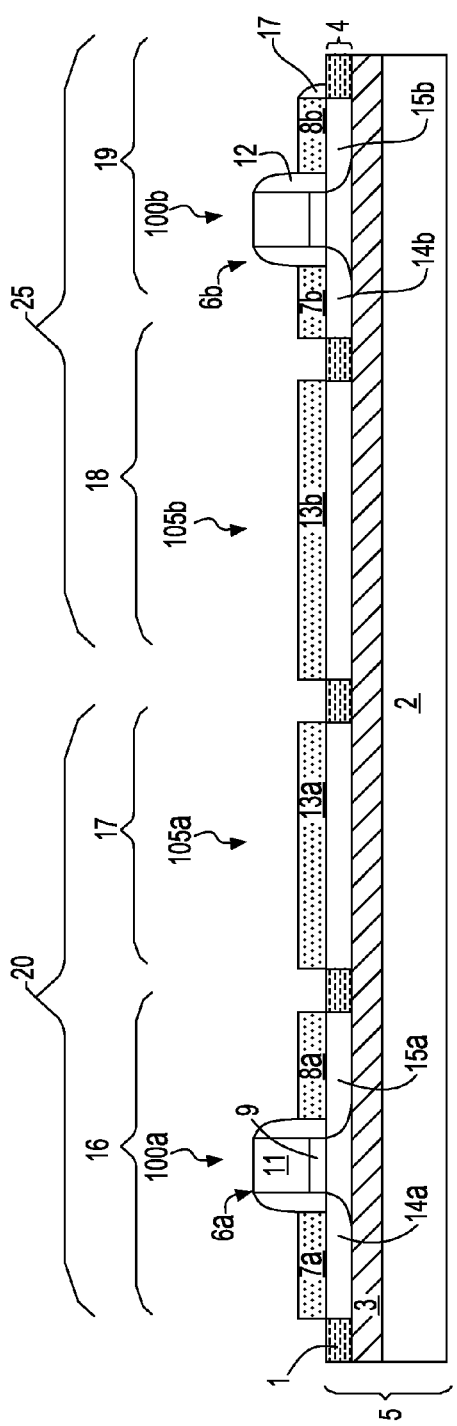
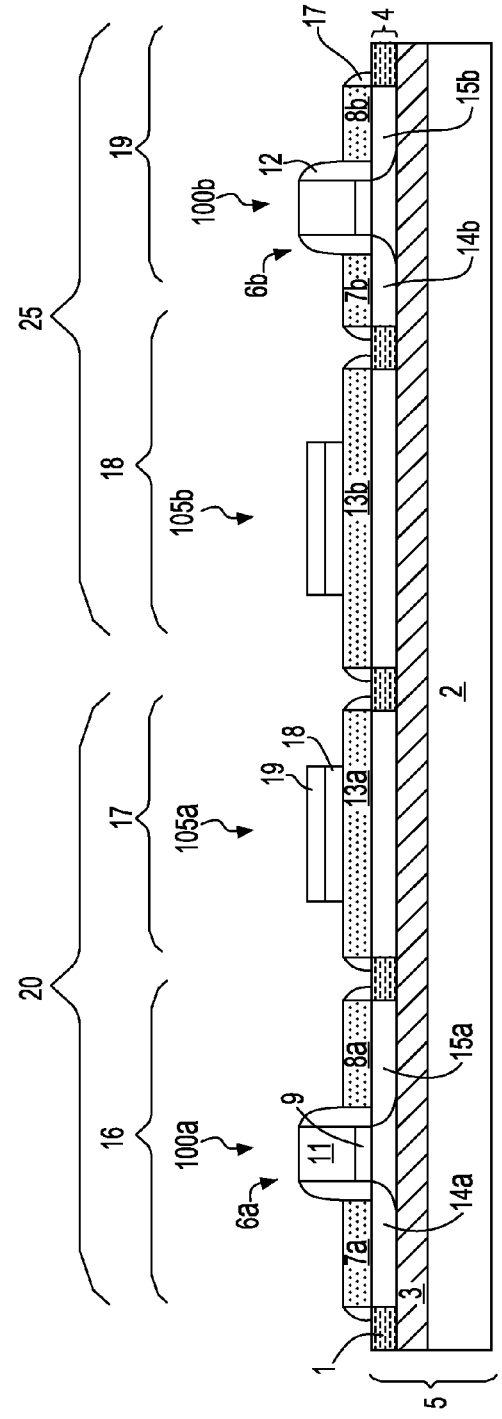

EXTREMELY THIN SEMICONDUCTOR-ON-INSULATOR (ETSOI) INTEGRATED CIRCUIT WITH ON-CHIP RESISTORS AND METHOD OF FORMING THE SAME

CROSS REFERENCE TO RELATED APPLICATION

This application is a divisional of U.S. patent application Ser. No. 12/687,273, filed Jan. 14, 2010 the entire content and disclosure of which is incorporated herein by reference.

BACKGROUND

The present disclosure relates generally to semiconductor devices. More particularly, the present disclosure relates to semiconductor devices formed on a semiconductor-on-insulator substrate having resistors integrated thereon.

In order to be able to make integrated circuits (ICs), such as memory devices and logic devices, of higher integration density than currently feasible, one has to find ways to further downscale the dimensions of field effect transistors (FETs), such as metal-oxide-semiconductor field effect transistors (MOSFETs), and resistive structures, such as semiconductor resistors. Scaling achieves compactness and improves operating performance in devices by shrinking the overall dimensions of the device while maintaining the device's electrical properties. Additionally, all dimensions of the device are typically scaled simultaneously in order to optimize the electrical performance of the device.

SUMMARY

An electrical device is provided that in one embodiment includes a semiconductor-on-insulator (SOI) substrate having a semiconductor layer with a thickness of less than 10 nm. A semiconductor device having a raised source region and a raised drain region of a single crystal semiconductor material of a first conductivity present on a first surface of the semiconductor layer. A resistor comprised of the single crystal semiconductor material of the first conductivity is present on a second surface of the semiconductor layer.

In another embodiment, the semiconductor device includes a semiconductor-on-insulator (SOI) substrate having a first device region and a second device region, wherein the SOI substrate comprises a semiconductor layer with a thickness of less than 10 nm.

A first conductivity semiconductor device and a first conductivity resistor may be present in the first device region of the SOI substrate. The first conductivity semiconductor device includes a first raised source region and a first raised drain region each composed of a single crystal semiconductor material. The first conductivity resistor is also composed of the single crystal semiconductor material. A second conductivity semiconductor device and a second conductivity resistor are present in the second device region of the SOI substrate. The second conductivity semiconductor device includes a second raised source region and a second raised drain region composed of the single crystal semiconductor material. The second conductivity resistor is also composed of the single crystal semiconductor material.

In another aspect, a method of forming an electric device, such as an integrated circuit including semiconductor devices and resistors, is provided, in which the electrical device is formed on a semiconductor-on-insulator (SOI) substrate having a semiconductor layer with a thickness of less than 10 nm. In one embodiment, the method of forming an electrical device includes providing a substrate comprising at least a semiconductor layer atop a dielectric layer, wherein the semiconductor layer has a thickness of less than 10 nm. Isolation regions are formed through the semiconductor layer into contact with the dielectric layer to define at least a first surface of the semiconductor layer and a second surface of the semiconductor layer. A gate structure is formed on a portion of the first surface of the semiconductor layer, wherein a remaining portion of the first surface is exposed. A single crystal semiconductor material is epitaxially grown on the remaining portion of the first surface and the second surface of the semiconductor layer. The single crystal semiconductor material on the remaining portion of the first surface provides a raised source region and a raised drain region of a semiconductor device. The single crystal semiconductor material on the second surface provides an upper surface of a resistor.

A dielectric layer is formed on a portion of the upper surface of the resistor, wherein end portions of the upper surface of the resistor are exposed. Semiconductor metal alloy contacts are formed on at least the end portions of the upper surface of the resistor and an upper surface of the raised source region and the raised drain region of the semiconductor device.

DESCRIPTION OF THE SEVERAL VIEWS OF THE DRAWINGS

The following detailed description, given by way of example and not intended to limit the invention solely thereto, will best be appreciated in conjunction with the accompanying drawings, wherein like reference numerals denote like elements and parts, in which:

FIG. 5 is a side cross-sectional view depicting epitaxially growing a single crystal semiconductor material on the first surface and the second surface of the first semiconductor layer to provide raised source regions and raised drain regions for semiconductor devices, and epitaxially growing the single crystal semiconductor material on the second surface and third surface of the first semiconductor layer to provide at least one resistor body for semiconductor-containing resistors, in accordance with one embodiment of the present method.

FIG. 6 is a side cross-sectional view depicting one embodiment of forming a dielectric layer on a portion of the upper surface of the at least one resistor body, in which the end portions of the upper surface of the at least one resistor body is exposed, in accordance with the present method.

DETAILED DESCRIPTION

Figure 1:
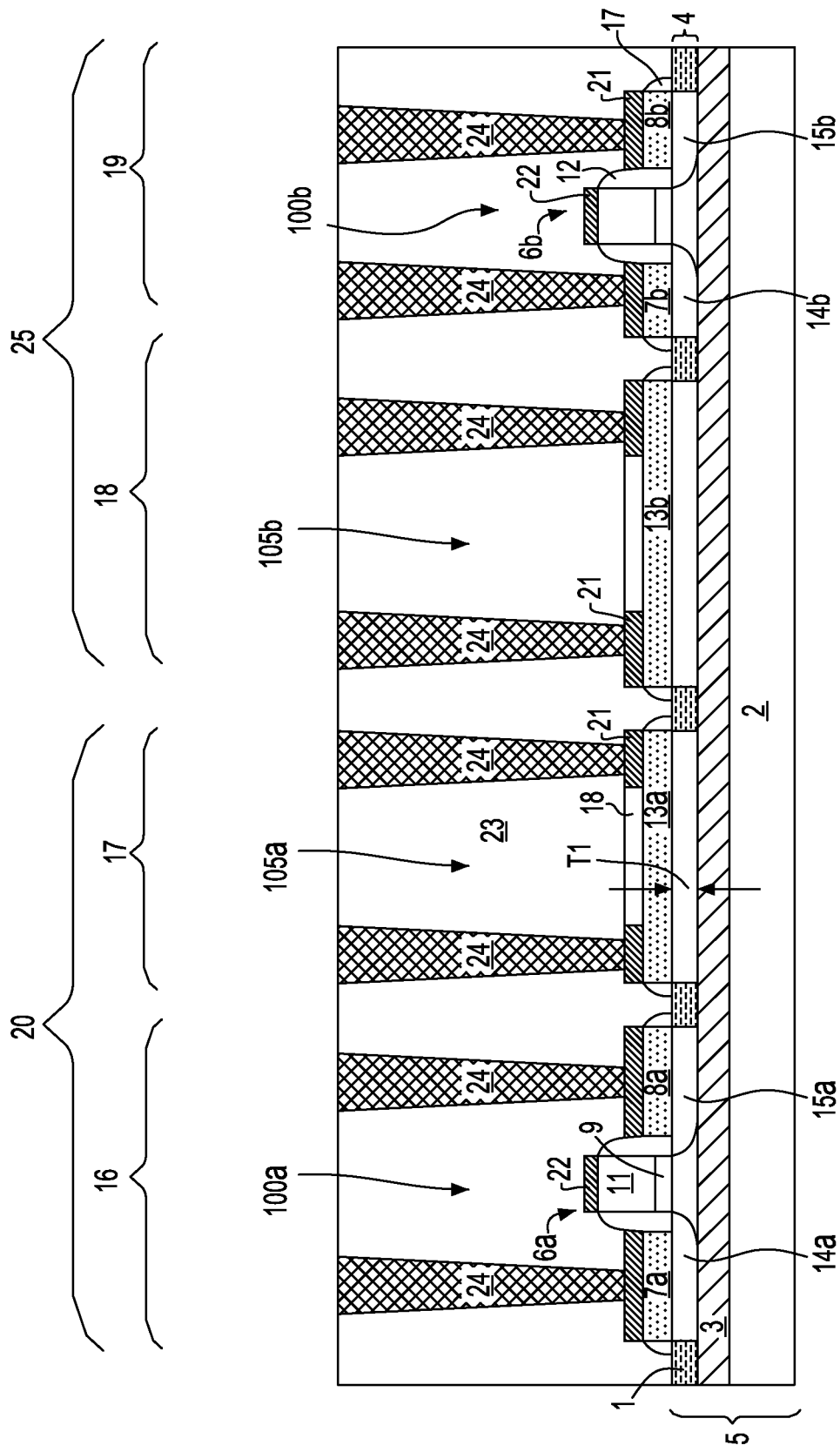
FIG. 1 is a side cross-sectional view of one embodiment of an electrical device including a semiconductor-on-insulator (SOI) substrate having a first device region and a second device region, in which each of the first and second device region include semiconductor devices and resistors, in accordance with the present structure.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

In one embodiment, the present invention relates to a method for forming semiconductor devices and resistors, e.g., on-chip resistors, on a semiconductor-on-insulator (SOI) substrate having an extremely thin semiconductor-on-insulator (ETSOI) layer. An extremely thin semiconductor-on-insulator (ETSOI) layer is the semiconductor layer that is present atop the buried insulating layer of an SOI substrate, wherein the ETSOI layer has a thickness of 10 nm or less. In accordance with the present method, raised source regions and raised drain regions are formed on the upper surface of ETSOI layer, in which the semiconductor is present. The raised source regions and raised drain regions are formed using an epitaxial deposition process that also provides an epitaxial semiconductor material for the resistor. In one embodiment, the epitaxial growth process for the raised source and drain regions and the upper surface of the resistor body provides that both the raised source and drain regions and the resistor are composed of a single crystal semiconductor material. Further, in one embodiment, because the same epitaxial process provides the raised source and drain regions of the semiconductor device, and the resistor body of the resistor, the thickness of the resistor body and the raised source and drain regions may be the same. Additionally, in some embodiments, the in-situ doping of the epitaxially grown resistor provides that the dopant concentration of the resistor is precisely controlled. Further, by forming the resistor on the upper semiconductor layer, i.e., first semiconductor layer, overlying the buried insulating layer of a semiconductor-on-insulator (SOI) substrate 5, the resistors are isolated from substrate noise. When describing the following structures and methods, the following terms have the following meanings, unless otherwise indicated.

As used herein, the term "raised" in combination with source and/or drain denotes that the source and/or drain region is formed on a semiconductor material layer that is present on an upper surface of the substrate on which the gate dielectric is present.

As used herein, the term "single crystal material" denotes a crystalline solid, in which the crystal lattice of the entire sample is continuous and substantially unbroken to the edges of the sample, with substantially no grain boundaries.

"Epitaxial growth and/or deposition" means the growth of a semiconductor material on a deposition surface of a semiconductor material, in which the semiconductor material being grown has the same crystalline characteristics as the semiconductor material of the deposition surface.

The term "direct contact" or "directly on" means that a first element, such as a first structure, and a second element, such as a second structure, are physically in contact without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

FIG. 1 depicts an electrical device including a semiconductor-on-insulator (SOI) substrate 5 having a first device region 20 and a second device region 25. The SOI substrate 5 includes a first semiconductor layer 4 with a thickness $T_1$ of less than 10 nm. A first conductivity semiconductor device 100a and a first conductivity resistor 105a may be present in the first device region 20 of the SOI substrate 5. A semiconductor device is an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In one embodiment, the semiconductor device may be a field effect transistor (FET), such as a metal oxide semiconductor field effect transistor (MOSFET). A field effect transistor is a transistor in which output current, i.e., source-drain current, is controlled by the voltage applied to the gate. A field effect transistor typically has three terminals, i.e., gate, source and drain.

In one embodiment, the first conductivity semiconductor device 100a includes a first raised source region 7a and a first raised drain region 8a of a single crystal semiconductor material that is present on a first surface 16 of the first semiconductor layer 4. In one embodiment, the first conductivity resistor 105a includes a first resistor body 13a that is also composed of a single crystal semiconductor material, in which the single crystal semiconductor material of the first conductivity resistor 105a may have the same composition as the single crystal semiconductor material of the first conductivity semiconductor device 100a. In one embodiment, the first conductivity resistor 105a is a semiconductor-containing resistor. A "semiconductor-containing resistor" is a device having a resistor body composed of a semiconductor material, i.e., semiconductor component, and terminals at opposing ends of the semiconductor material. In one embodiment, the first resistor body 13a has a resistivity greater than 0.0001 ohm-cm.

Still referring to FIG. 1, a second conductivity semiconductor device 100b and a second conductivity resistor 105b are present in the second device region 25 of the SOI substrate 5. The second conductivity semiconductor device 100b includes a second raised source region 7b and a second raised drain region 8b composed of the single crystal semiconductor material. The second conductivity resistor 105b includes a second semiconductor body 13b that is also composed of the single crystal semiconductor material. In one embodiment, the second resistor body 13b has a resistivity greater than 0.0001 ohm-cm. The single crystal semiconductor material of the second conductivity resistor 105b may be the same as the single crystal semiconductor material of the second conductivity semiconductor device 100b. The resistivity of the first conductivity resistor 105a and the second conductivity resistor 105b typically ranges from 0.0001 ohm-cm to 1 ohm-cm in order to match the impedance of typical field effect transistors.

The term "conductivity" as used above to describe the first conductivity semiconductor device 100a, the second conductivity semiconductor device 100b, the first conductivity resistor 105a, and the second conductivity resistor 105b denotes that the majority dopant of the semiconductor material is either p-type or n-type. For instance, a first conductivity semiconductor device 100a may have source and drain regions doped with n-type dopants and a second conductivity semiconductor device 100b may have source and drain regions doped with p-type dopants. The first conductivity resistor 105a may have a first resistor body 13a composed of a semiconductor material doped with a n-type dopant, and a second conductivity resistor 105b may have a second resistor body 13b composed of a semiconductor material doped with a p-type dopant.

P-type refers to the addition of impurities to an intrinsic semiconductor that creates deficiencies of valence electrons. In a silicon-containing substrate, examples of n-type dopants, i.e., impurities, include but are not limited to: boron, aluminum, gallium and indium. N-type refers to the addition of impurities that contributes free electrons to an intrinsic semiconductor. In a silicon-containing substrate examples of n-type dopants, i.e., impurities, include but are not limited to antimony, arsenic and phosphorous.

In one embodiment, the structure depicted in FIG. 1 is a extremely thin semiconductor-on-insulator (ETSOI) integrated circuit that includes a n-type field effect transistor (nFET), i.e., first conductivity semiconductor device 100a, a p-type field effect transistor (pFET), i.e., second conductivity semiconductor device 100b, an on-chip n-type semiconductor resistor 105a, i.e., first conductivity resistor 105a, and an on-chip p-type semiconductor resistor, i.e., second conductivity resistor 105b. It is noted that further details of the structures depicted in FIG. 1 are discussed in the following description of FIGS. 2-7.

Figure 2:
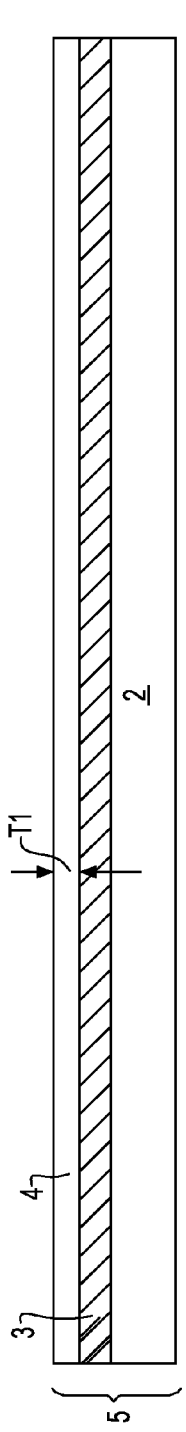
FIG. 2 is a side cross-sectional view depicting providing a substrate comprising at least a first semiconductor layer atop a dielectric layer, wherein the first semiconductor layer has a thickness of less than 10 nm, as used in one embodiment of the present method.

FIGS. 2-7 depict one embodiment of a method of forming semiconductor devices 100a, 100b and resistors 105a, 105b, e.g., on-chip resistors, on a semiconductor-on-insulator (SOI) substrate 5 having an extremely thin semiconductor-on-insulator (ETSOI) layer, i.e., first semiconductor layer 4. FIG. 2 illustrates the results of the initial processing steps that produce an SOI substrate 5. The SOI substrate 5 includes at least a first semiconductor layer 4 (also referred to as an ETSOI layer) having a thickness $T_1$ of less than 10 nm, in which the first semiconductor layer 4 is overlying a buried dielectric layer 3. A second semiconductor layer 2 may be present underlying the buried dielectric layer 3.

The first semiconductor layer 4 may comprise any semiconducting material including, but not limited to Si, strained Si, SiC, SiGe, SiGeC, Si alloys, Ge, Ge alloys, GaAs, InAs, and InP, or any combination thereof. The first semiconductor layer 4 may be thinned to a desired thickness by planarization, grinding, wet etch, dry etch, oxidation followed by oxide etch, or any combination thereof. One method of thinning the first semiconductor layer 4 is to oxidize the Si by a thermal dry or wet oxidation process, and then wet etch the oxide layer using a hydrofluoric acid mixture. This process can be repeated to achieve the desired thickness. In one embodiment, the first semiconductor layer 4 has a thickness $T_1$ ranging from 1.0 nm to 10.0 nm. In another embodiment, the first semiconductor layer 4 has a thickness $T_1$ ranging from 1.0 nm to 5.0 nm. In a further embodiment, the first semiconductor layer 4 has a thickness $T_1$ ranging from 3.0 nm to 8.0 nm. Typically, the first semiconductor layer 4 is a single crystal material. The thickness $T_1$ of the first semiconductor layer 4 typically characterizes the layer as an extremely thin semiconductor-on-insulator layer (ETSOI) layer. The second semiconductor layer 2 may be a semiconducting material including, but not limited to Si, strained Si, SiC, SiGe, SiGeC, Si alloys, Ge, Ge alloys, GaAs, InAs, InP as well as other III/V and II/VI compound semiconductors.

The dielectric layer 3 that is present underlying the first semiconductor layer 4 and atop the second semiconductor layer 2 may be formed by implanting a high-energy dopant into the SOI substrate 5 and then annealing the structure to form a buried insulating layer, i.e., dielectric layer 3. In another embodiment, the dielectric layer 3 may be deposited or grown prior to the formation of the first semiconductor layer 4. In yet another embodiment, the SOI substrate 5 may be formed using wafer-bonding techniques, where a bonded wafer pair is formed utilizing glue, adhesive polymer, or direct bonding.

Figure 3:
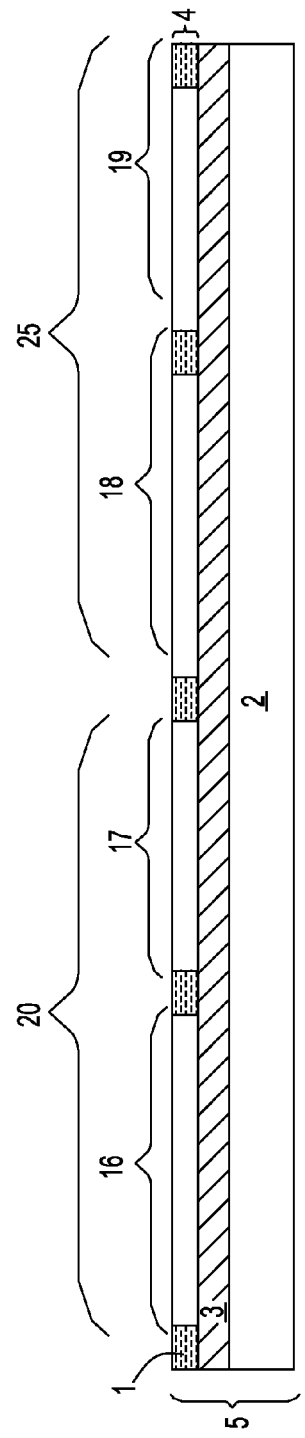
FIG. 3 is a side cross-sectional view depicting forming isolation regions through the first semiconductor layer into contact with the dielectric layer to define at least a first surface and a second surface of the first semiconductor layer within the first device region, and a third surface and a fourth surface of the first semiconductor layer within the second device region, in accordance with one embodiment of the present method.

FIG. 3 depicts forming isolation regions 1 through the first semiconductor layer 4 into contact with the dielectric layer 3. In one embodiment, an isolation region 1 separates the first device region 20 of the SOI substrate 5 from the second device region 25 of the SOI substrate 5. The positioning of the isolation regions 1 define at least a first surface 16 and a second surface 17 of the first semiconductor layer 4 in the first device region 20 of the SOI substrate 5. The positioning of the isolation regions 1 also define a third surface 18 and a fourth surface 19 of the first semiconductor layer 4 in the second device region 25 of the SOI substrate 5.

In one embodiment, the isolation regions 1 may be formed extending through the first semiconductor layer 4 stopping on the dielectric layer 3 i.e., buried insulating layer. In one embodiment, the isolation regions 1 are formed by etching a trench into the SOI substrate 5 utilizing an anisotropic etching process, such as reactive-ion etching (RIE) or plasma etching. The trenches may optionally be lined with a liner material, e.g., an oxide, and then CVD or another like deposition process is used to fill the trench with polysilicon or another like STI dielectric material, such as an oxide, nitride or oxynitride. The STI dielectric may optionally be densified after deposition. A planarization process, such as chemical-mechanical polishing (CMP), may optionally be used to provide a planar structure, as depicted in FIG. 3. Besides STI isolation, isolation regions 1 can be formed by other isolation techniques, including but not limited to, mesa isolation, local oxidation of silicon (LOCOS) isolation, etc.

Figure 4:
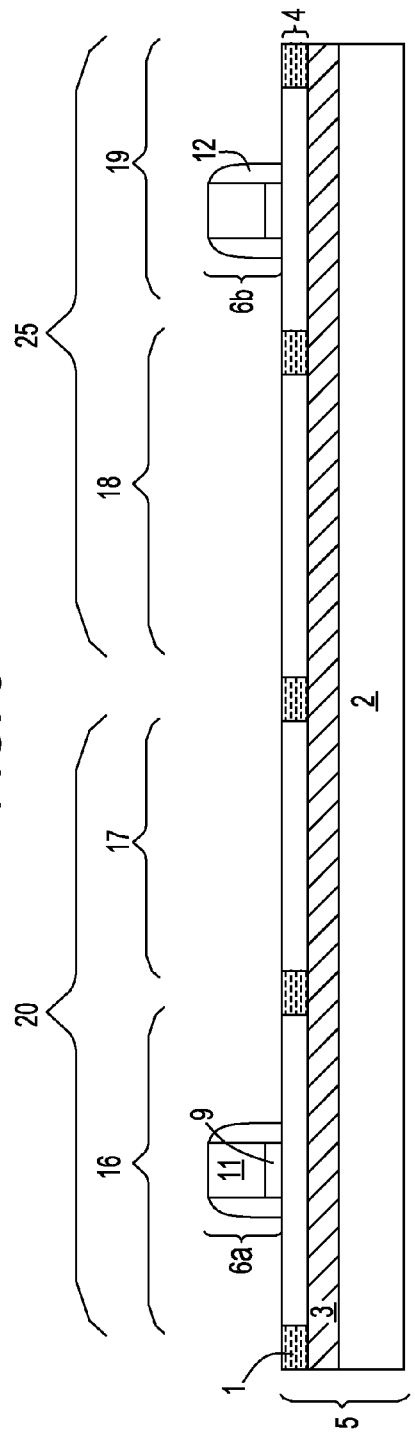
FIG. 4 is side cross-sectional view depicting forming a first gate structure on a portion of the first surface of the first semiconductor layer in the first device region, and a second gate structure on a portion of fourth surface of the first semiconductor layer in the second device region, in accordance with one embodiment of the present method.

FIG. 4 depicts forming a first gate structure 6a on a portion of the first surface 16 of the first semiconductor layer 4 in the first device region 20, and a second gate structure 6b on a portion of fourth surface 19 of the first semiconductor layer 4 in the second device region 25. A remaining portion of the first surface 16 and the fourth surface 19 that is not underlying the first and second gate structure 6a, 6b is exposed, and provides the location for the subsequently formed raised source and drain regions.

The first gate structure 6a and second gate structure 6b can be formed using deposition, photolithography and a selective etching process. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions. In one embodiment, a hard mask (not depicted in FIG. 4) may be used to form the first gate structure 6a and the second gate structure 6b. A dielectric cap may be formed by first depositing a dielectric hard mask material, like silicon nitride or silicon oxide, atop a layer of gate electrode material (also referred to as gate conductor material), and then applying a photoresist pattern to the hard mask material using a lithography process steps. The photoresist pattern is then transferred into the hard mask material using a dry etch process forming the dielectric cap. Next the photoresist pattern is removed and the dielectric cap pattern is then transferred into the gate electrode material during a selective etching process. The dielectric cap may be removed by a wet or dry etch. Alternatively, the first and second gate structure 6a, 6b can be formed by other patterning techniques such as spacer image transfer.

The first gate structure 6a and the second gate structure 6b may each include at least one gate conductor 11 atop at least one gate dielectric 9. In one example, the gate conductor 11 may be a doped semiconductor material, such as a doped silicon containing material, e.g., doped polysilicon. The gate conductor 11 may also be a metal gate electrode. The metal gate electrode may be any conductive metal including, but not limited to W, Ni, Ti, Mo, Ta, Cu, Pt, Ag, Au, Ru, Ir, Rh, and Re, and alloys that include at least one of the aforementioned conductive elemental metals. When a combination of conductive elements is employed, an optional diffusion barrier material such as TaN or WN may be formed between the conductive materials.

The gate dielectric 9 may be a dielectric material, such as silicon oxide, or alternatively high-k dielectrics. Some examples of high-k dielectric materials suitable for the gate dielectric 9 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof. In one embodiment, the gate dielectric 9 has a thickness ranging from 1 nm to 10 nm. In another embodiment, the gate dielectric 9 has a thickness ranging from 1.5 nm to 2.5 nm.

A set of first spacers 12 can be formed in direct contact with the sidewalls of the first and second gate structures 6a, 6b. The first spacers 12 are typically narrow having a width ranging from 2.0 nm to 15.0 nm. The first spacers 12 can be formed using deposition and etch processing steps. The first spacers 12 may be composed of a dielectric, such as nitride, oxide, oxynitride, or a combination thereof. The thickness of the first spacers 12 determines the proximity of the subsequently formed raised source regions 7a, 7b and the raised drain regions 8a, 8b to the channel of the device. The channel is the region underlying the gate structure, e.g., first and second gate structure 6a, 6b, and between the source and drain of a semiconductor device that becomes conductive when the semiconductor device is turned on.

FIG. 5 depicts one embodiment of forming a single crystal semiconductor material on the exposed surfaces of the first semiconductor layer 4. In one embodiment, the single crystal semiconductor material is formed on the exposed portions of the first surface 16 and the fourth surface 19 of the first semiconductor layer 4 that are adjacent to the first and second gate structures 6a, 6b. The single crystal semiconductor material that is formed on the first surface 16 of the first semiconductor layer 4 provides the first raised source region 7a and the first raised drain region 8a of the first conductivity semiconductor device 100a. The single crystal semiconductor material formed on the fourth surface 19 of the first semiconductor layer 4 provides the second raised source region 7b and the second raised drain region 8b of the second conductivity semiconductor 100b. The single crystal semiconductor material that is formed on the second surface 17 of the first semiconductor layer 4 provides the first resistor body 13a of the first conductivity resistor 105a, and the single crystal semiconductor material that is formed on the third surface 18 of the first semiconductor layer 4 provides the second resistor body 13b of the second conductivity resistor 105b.

In one embodiment, the single crystal semiconductor material is formed using an epitaxial growth process. In one embodiment, in which the single crystal semiconductor material is single crystal silicon formed using an epitaxial growth process, the material may be referred to as epitaxial silicon. When the chemical reactants are controlled and the system parameters set correctly, the depositing atoms arrive at the surface, i.e., first surface 16, second surface 17, third surface 18, and fourth surface 19, of the first semiconductor layer 4 with sufficient energy to move around on the surface and orient themselves to the crystal arrangement of the atoms of the deposition surface. Thus, an epitaxial film deposited on a $\{100\}$ crystal surface will take on a $\{100\}$ orientation. In the embodiments, in which the first semiconductor layer 4 is a single crystal semiconductor material, e.g., single crystal silicon, the material being deposited by the epitaxial growth process will be a single crystal semiconductor material, i.e., single crystal silicon. If, on the other hand, the wafer surface has an amorphous surface layer, possibly the result of implanting, the depositing atoms have no surface to align to, resulting in the formation of polysilicon instead of single crystal silicon. Embodiments have been contemplate in which the raised source regions 7a, 7b, and the raised drain regions 8a, 8b are formed of selectively grown polysilicon.

A number of different sources may be used for the deposition of epitaxial silicon. Silicon sources for epitaxial growth include silicon tetrachloride, dichlorosilane ($SiH_2Cl_2$), and silane ($SiH_4$). The temperature for epitaxial silicon deposition typically ranges from 450° C. to 900° C. Although higher temperature typically results in faster deposition, the faster deposition may result in crystal defects and film cracking.

In another embodiment, the single crystal semiconductor material may be provided by selective-epitaxial growth of SiGe atop the first semiconductor layer 4. The Ge content of the epitaxial grown SiGe may range from 5% to 60%, by atomic weight %. In another embodiment, the Ge content of the epitaxial grown SiGe may range from 10% to 40%. The epitaxial grown SiGe may be under an intrinsic compressive strain, in which the compressive strain is produced by a lattice mismatch between the larger lattice dimension of the SiGe and the smaller lattice dimension of the layer on which the SiGe is epitaxially grown. In yet another embodiment, the single crystal semiconductor material is composed of epitaxially grown Si:C or carbon doped silicon. The carbon (C) content of the epitaxial grown Si:C ranges from 0.3% to 10%, by atomic weight %. In another embodiment, the carbon (C) content of the epitaxial grown Si:C may range from 1% to 2%. The epitaxial grown Si:C may be under an intrinsic tensile strain, in which the tensile strain is produced by a lattice mismatch between the smaller lattice dimension of the Si:C and the larger lattice dimension of the layer on which the Si:C is epitaxially grown.

The single crystal semiconductor material may be in-situ doped during the epitaxial growth process to provide the conductivity type of the first conductivity semiconductor device 100a, the second conductivity semiconductor device 100b, the first conductivity resistor 105a and the second conductivity regions 105b. In one embodiment, the first conductivity semiconductor device 100a and the first conductivity resistor 105a have the same conductivity type, and the second conductivity semiconductor device 100b and the second conductivity resistors 105b have the same conductivity type. The conductivity type of the first conductivity semiconductor device 100a and the first conductivity resistor 105a is different than the conductivity type of the second conductivity semiconductor device 100b and the second conductivity resistor 105b.

Epitaxial growth is selective to semiconductor surfaces. In some embodiments, block masks are utilized to provide that the single crystal semiconductor material can be in-situ doped to provide different conductivities for the semiconductor devices 100a, 100b, and the resistors 105a, 105b. For example, in one embodiment, a first block mask is formed protecting the second device region 25 including the third surface 18 and the fourth surface 19 of the first semiconductor layer 4, in which the second conductivity semiconductor device 100b and the second conductivity resistor 105b are formed. The first device region 20 includes the exposed portion of the first semiconductor layer 4, i.e., first surface 16 and second surface 17, which is not protected by the first block mask and is subsequently processed to provide the first conductivity semiconductor device 100a and the first conductivity resistor 105a.

The first block mask may comprise conventional soft and/or hardmask materials and can be formed using deposition, photolithography and etching. A photoresist first block mask can be produced by applying a photoresist layer to the entirety of the surface of the first semiconductor layer 4, exposing the photoresist layer to a pattern of radiation, and then developing the pattern into the photoresist layer utilizing resist developer. In another embodiment, the first block mask can be a hardmask material. Hardmask materials include dielectric systems that may be deposited by chemical vapor deposition (CVD) and related methods. Typically, the hardmask composition includes silicon oxides, silicon carbides, silicon nitrides, silicon carbonitrides, etc. Spin-on dielectrics may also be utilized as a hardmask material including, but not limited to: silsequioxanes, siloxanes, and boron phosphate silicate glass (BPSG). A first block mask comprising a hardmask material may be formed by blanket depositing a layer of hardmask material, providing a patterned photoresist atop the layer of hardmask material, and then etching the layer of hardmask material to provide a first block mask protecting the second device region 25, in which etching comprises an etch chemistry having a high selectivity to the patterned photoresist and the surface of the first device region 20.

Following formation of the first block mask, the in-situ doped single crystal semiconductor material that provides the conductivity type of the first conductivity type semiconductor device 100a and the first conductivity resistor 105a is epitaxially formed on the first surface 16 and the second surface 17 of the first semiconductor layer 4. The first block mask being composed of a dielectric material and formed over the second device region 25 obstructs the epitaxial growth of the in-situ doped single crystal semiconductor material on the third surface 18 and the fourth surface 19 of the first semiconductor layer 4. Following the formation of the in-situ doped single crystal semiconductor material that provides the conductivity type of the first conductivity semiconductor device 100a and the first conductivity resistor 105a, the first block mask is stripped using a chemical strip process, oxygen ashing, selective etching or a combination thereof. Thereafter, a second block mask is formed over the first device region 20 protecting the in-situ doped single crystal semiconductor material of the first conductivity semiconductor device 100a and the first conductivity resistor 105a. The second block mask exposes the second device region 25 of the SOI substrate 5. An in-situ doped single crystal semiconductor material that provides the conductivity type of the second conductivity semiconductor device 100b and the second conductivity resistor 105b is epitaxially formed on the third surface 18 and the fourth surface 19 of the first semiconductor layer 4.

P-type field effect transistors are produced on the first surface 16 and the fourth surface 19 of the first semiconductor layer 4 by doping the single crystal semiconductor material with elements from group III of the Periodic Table of Elements to provide the raised source regions 7a, 7b and the raised drain regions 8a, 8b. In one embodiment, the group III element is boron, aluminum, gallium or indium. In one example, in which the single crystal semiconductor material is doped to provide p-type conductivity, the dopant may be boron present in a concentration ranging from $1\times10^{18}$ atoms/cm$^3$ to $2\times10^{21}$ atoms/cm$^3$. N-type field effect transistors are produced on the first surface 16 and the fourth surface 19 of the first semiconductor layer 4 by doping the single crystal semiconductor material with group V elements from the Periodic Table of Elements, such as phosphorus (P), antimony, or arsenic (As).

In one example, the first and second resistor body 13a, 13b of the first and second conductivity resistors 105a, 105b may be composed of an epitaxially grown single crystal semiconductor material that has been in-situ doped with at least one of n-type or p-type dopants. For example, the first and second resistor body 13a, 13b may be in-situ doped with boron, arsenic, or phosphorus in a doping concentration ranging from $1\times10^{15}$ cm$^{-3}$ to $1\times10^{21}$ cm$^{-3}$. In another example, the first and second resistor body 13a, 13b may be in-situ doped with boron, arsenic, or phosphorus in a doping concentration ranging from $1\times10^{19}$ cm$^{-3}$ to $1\times10^{21}$ cm$^{-3}$.

The single crystal semiconductor material that provides the raised source regions 7a, 7b, the raised drain regions 8a, 8b and the first and second resistor body 13a, 13b may also be doped using ion implantation. For example, in some embodiments, the single crystal semiconductor material may be epitaxially grown atop at least one of the first surface 16, second surface 17, third surface 18 and fourth surface 19 without being doped during the epitaxial growth process. Following epitaxial growth, the single crystal semiconductor material may be doped by ion implantation to introduce n-type or p-type dopants into the raised source regions 7a, 7b and raised drain regions 8a, 8b of the first and second conductivity semiconductor devices 100a, 100b, and the first and second resistor body 13a, 14b of the first and second conductivity resistors 105a, 105b.

Ion implantation may be selectivity applied by utilizing block masks, e.g., photoresist block masks or hard block masks. The block masks used during ion implantation may be similar in composition and application to the block masks used during the above described in-situ doping and epitaxial growth process. In yet another embodiment, an in-situ doped first crystal semiconductor material may be counter doped using ion implantation from a first conductivity to an opposing second conductivity.

The dopant from the doped first conductivity semiconductor material, i.e., raised source regions 7a, 7b, raised drain regions 8a, 8b, and first and second resistor body 13a, 13b, may be diffused into the underlying first semiconductor layer 4. For example, the dopant from the raised source regions 7a, 7b, and raised drain regions 8a, 8b, may be diffused into the underlying first semiconductor layer 4 to provide extension source regions 14a, 14b and extension drain regions 15a, 15b. In the embodiments in which the first raised source region 7a and the first raised drain region 8a have been doped to a p-type conductivity, the first extension source regions 14a and first extension drain region 15a that are formed in the first semiconductor layer 4 have a p-type conductivity. In the embodiments, in which the second raised source region 7b and the second raised drain region 8b have been doped to an n-type conductivity, the second extension source region 14b and second extension drain region 15b that are formed in the first semiconductor layer 4 have an n-type conductivity.

Typically, the dopant concentration of the extension regions 14a, 14b, 15a, 15b having the p-type conductivity ranges from $1\times10^{19}$ atoms/cm$^3$ to $2\times10^{21}$ atoms/cm$^3$. In another embodiment, the extension regions 14a, 14b, 15a, 15b having the p-type conductivity ranging from $2\times10^{19}$ atoms/cm$^3$ to $5\times10^{20}$ atoms/cm$^3$. The dopant concentration of the extension regions 14a, 14b, 15a, 15b having the n-type conductivity ranges from $1\times10^{19}$ atoms/cm$^3$ to $2\times10^{21}$ atoms/cm$^3$. In another embodiment, the extension regions 14a, 14b, 15a, 15b having the n-type conductivity ranging from $2\times10^{19}$ atoms/cm$^3$ to $5\times10^{20}$ atoms/cm$^3$.

In one embodiment, the extension regions 14a, 14b, 15a, 15b have a depth that extends the entire depth of the first semiconductor layer 4. Therefore, the extension regions 14a, 14b, 15a, 15b have a depth of less than 10 nm, typically being 3 nm to 8 nm in depth, as measured from the upper surface of the first semiconductor layer 4. In one embodiment, dopant from the first and second resistor body 13a, 13b diffuses into the underlying first semiconductor layer 4. The concentration of the dopant from the first and second resistor body 13a, 13b that is present in the first semiconductor layer 4 ranges from $1\times10^{18}$ atoms/cm$^3$ to $2\times10^{21}$ atoms/cm$^3$.

In one embodiment, the dopant from the single crystal semiconductor material is diffused into the first semiconductor layer 4 by an annealing processes including, but not limited to: rapid thermal annealing, furnace annealing, flash lamp annealing, laser annealing, or any suitable combination of thereof. In one embodiment, thermal annealing to diffuse the dopant from the single crystal semiconductor material into the first semiconductor layer 4 is conducted at a temperature ranging from about 850° C. to about 1350° C.

FIG. 6 depicts forming a second spacer 17 in direct contact with the sidewalls of the first and second raised source regions 7a, 7b, the first and second raised drain regions 8a, 8b and the first and second resistor bodies 13a, 13b. The second spacers 17 may be formed by depositing a conformal dielectric film and using a highly directional dry etch process. The second spacers 17 may be composed of a dielectric such as a nitride, oxide, oxynitride, high-k dielectric, or a combination thereof. The second spacers 17 are optional and may be omitted.

FIG. 6 further depicts one embodiment of forming a dielectric layer 18 on a portion of the upper surface of the first conductivity resistor 105a and the second conductivity resistor 105b, in which the end portions of the upper surface of the first conductivity resistor 105a and the second conductivity resistor 105b are exposed. In one embodiment, the dielectric layer 18 is comprised of an oxide, nitride or oxynitride material. For example, when the dielectric layer 18 is an oxide, the oxide may be silicon oxide. In another example, in which the dielectric layer 18 is a nitride, the nitride may be silicon nitride. The dielectric layer 18 may be formed by a deposition process, such as chemical vapor deposition (CVD). Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes include, but are not limited to: Atmospheric Pressure CVD (APCVD), Low Pressure CVD (LPCVD), Plasma Enhanced CVD (PECVD), Metal-Organic CVD (MOCVD), ultra-high vacuum CVD (UHV-CVD) and combinations thereof. Other examples of processed for depositing a dielectric layer 18 include atomic layer deposition (ALD), evaporation, chemical solution deposition and other like deposition processes. The thickness of the dielectric layer 18 may range from 5 nm to 100 nm. In another embodiment, the thickness of the dielectric layer 18 may range from 10 nm to 50 nm.

In one embodiment, the dielectric layer 18 is deposited atop the entirety of the upper surface of the first resistor body 13a and the second resistor body 13b. Following deposition, the dielectric layer 18 may then be patterned and etched to expose the end portions of the first resistor body 13a and the second resistor body 13b. The patterned dielectric layer 18 may be formed utilizing photolithography and etch process steps. Specifically, a pattern is produced by applying a photoresist 19 to the surface to be etched, exposing the photoresist 19 to a pattern of radiation, and then developing the pattern into the photoresist 19 utilizing conventional resist developer. Once the patterning of the photoresist 19 is completed, the sections of the dielectric layer 18 covered by the photoresist 19 are protected, while the exposed portions of the dielectric layer 18 are removed using a selective etching process that removes the unprotected portions. As used herein, the term "selective" in reference to a material removal process denotes that the rate of material removal for a first material is greater than the rate of removal for at least another material of the structure to which the material removal process is being applied. For example, the exposed portions of the dielectric layer 18 may be removed by an etch chemistry that removes the material of the dielectric layer 18 selective to the first semiconductor layer 4 and the photoresist 19. The photoresist 19 may then be removed by oxygen ashing or chemical stripping.

Figure 7:
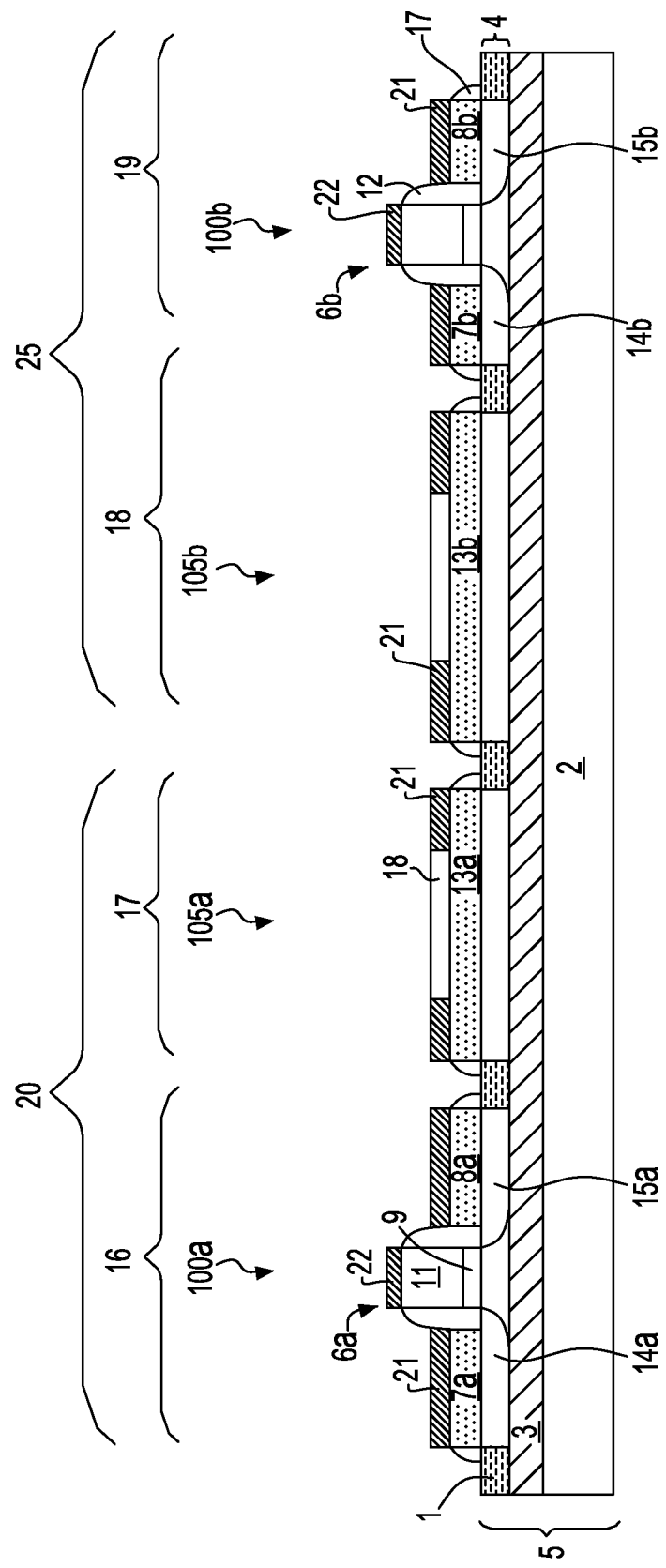
FIG. 7 is a side cross-sectional view depicting one embodiment of forming semiconductor metal alloy contacts on at least the exposed end portions of the at least one resistor body, and an upper surface of the raised source regions and the raised drain regions, in accordance with the present method.

FIG. 7 depicts one embodiment of forming semiconductor metal alloy contacts 21 on at least the end portions of the upper surface of the first and second resistor body 13a, 13b. The semiconductor metal alloy contacts 21 may also be formed on an upper surface of the first and second raised source region 7a, 7b, and an upper surface of the first and second raised drain region 8a, 8b. The formation of the semiconductor metal alloy contacts 21, e.g., silicides contact, typically requires depositing a refractory metal such as cobalt, nickel, or titanium onto the surface of a semiconductor material, e.g., Si-containing material. Following deposition, the structure is subjected to an annealing step using processes such as, but not limited to, rapid thermal annealing. During thermal annealing, the deposited metal reacts with semiconductor forming a metal semiconductor alloy, e.g., metal silicide. The remaining unreacted metal is removed by an etch process selective to metal semiconductor alloy. Gate silicides 22 may also be formed on the gate conductor 11.

Referring to FIG. 1, following the formation of the semiconductor metal alloy contacts 21, a layer of interlevel dielectric material 23 can be blanket deposited atop the entire structure depicted in FIG. 6 and planarized. The interlevel dielectric material 23 may be selected from the group consisting of silicon-containing materials such as silicon oxide, silicon nitride, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric material 23 include: any of the aforementioned materials in porous form, or in a form that changes during processing to or from being porous and/or permeable to being non-porous and/or non-permeable. The deposited interlevel dielectric material 23 is then patterned and etched to form via holes to the various source/drain and gate conductor regions of the device. Following via formation interconnects 24 are formed by depositing a conductive metal into the via holes using deposition methods, such as CVD or plating. The conductive metal may include, but is not limited to: tungsten, copper, aluminum, silver, gold and alloys thereof.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An electrical device comprising:
   a semiconductor-on-insulator (SOI) substrate comprising a semiconductor layer with a thickness of less than 10 nm;
   a semiconductor device having a raised source region and a raised drain region of a single crystal semiconductor material of a first conductivity present on a first surface of the semiconductor layer; and
   a semiconductor-containing resistor comprised of the single crystal semiconductor material of the first conductivity present on a second surface of the semiconductor layer, wherein an upper surface of the single crystal semiconductor material is coplanar with an upper surface of the raised source region and the raised drain region.

2. The electrical device of claim 1, wherein the semiconductor layer of the SOI substrate is present on a buried insulating layer.

3. The electrical device of claim 2, wherein the semiconductor device further comprises an extension source region and an extension drain region present in the semiconductor layer and in direct contact with the raised source region and the raised drain region.

4. The electrical device of claim 2, wherein the semiconductor device is separated from the semiconductor-containing resistor by an isolation region positioned between the semiconductor device and the semiconductor-containing resistor, wherein the isolation region extends through the semiconductor layer into contact with the buried insulating layer.

5. The electrical device of claim 1, wherein the semiconductor layer is a material selected from the group consisting of Si, strained Si, SiC, SiGe, SiGeC, Si alloys, Ge, Ge alloys, GaAs, InAs, InP, and a combination thereof.

6. The electrical device of claim 1, wherein the semiconductor device further comprises a gate structure that is present between the raised source region and the raised drain region.

7. The electrical device of claim 1, wherein the first conductivity is provided by p-type or n-type dopants.

8. The electrical device of claim 1, wherein the single crystal semiconductor material is a composition selected from the group consisting of silicon, silicon germanium, silicon doped with carbon (Si:C) and a combination thereof.

9. An electrical device comprising:
   a semiconductor-on-insulator (SOI) substrate comprising a semiconductor layer with a thickness of less than 10 nm;
   a semiconductor device having a raised source region and a raised drain region of a single crystal semiconductor material of a first conductivity present on a first surface of the semiconductor layer; and
   a semiconductor-containing resistor comprised of the single crystal semiconductor material of the first conductivity present on a second surface of the semiconductor layer, wherein an upper surface of the single crystal semiconductor material is coplanar with an upper surface of the raised source region and the raised drain region, wherein the semiconductor-containing resistor further comprises metal semiconductor alloy contacts on opposing sides of the upper surface of the single crystal semiconductor material, wherein the metal semiconductor alloy contacts are separated by a dielectric layer that is present on the upper surface of the single crystal semiconductor material, the dielectric layer extending from one metal semiconductor alloy contact on one side of the single crystal semiconductor material to a second metal semiconductor alloy contact on a second opposite side of the single crystal semiconductor material.

10. An electrical device comprising:
    a semiconductor-on-insulator (SOI) substrate having a first device region and a second device region, wherein the SOI substrate comprises a semiconductor layer with a thickness of less than 10 nm;
    a first conductivity semiconductor device and a first conductivity semiconductor-containing resistor present in the first device region of the SOI substrate, the first conductivity semiconductor device comprising a first raised source region and a first raised drain region of a single crystal semiconductor material, and the first conductivity semiconductor-containing resistor is comprised of the single crystal semiconductor material, wherein an upper surface of a first resistor body of the single crystal semiconductor material for the first conductivity semiconductor-containing resistor is coplanar with an upper surface of the first raised source region and the first raised drain region; and
    a second conductivity semiconductor device and a second conductivity semiconductor-containing resistor present in the second device region of the SOI substrate, the second conductivity semiconductor device comprising a second raised source region and a second raised drain region comprised of the single crystal semiconductor material, and the second conductivity semiconductor-containing resistor is comprised of the single crystal semiconductor material, wherein an upper surface of a second resistor body of the single crystal semiconductor material for the second conductivity semiconductor-containing resistor is coplanar with an upper surface of the second raised source region and the second raised drain region.

11. The electric device of claim 10, wherein the first conductivity is p-type doped, and the second conductivity is n-type doped.

12. The electrical device of claim 10, wherein the semiconductor layer of the SOI substrate is present on a buried insulating layer.

13. The electrical device of claim 10, wherein the first conductivity semiconductor device further comprises a first gate structure that is present between the first raised source region and the first raised drain region, and the second conductivity semiconductor device further comprises a second gate structure that is present between the second raised source region and the second raised drain region.

14. The electrical device of claim 13, wherein the first conductivity semiconductor device further comprises a first extension source region and a first extension drain region present in the semiconductor layer and in direct contact with the first raised source region and the first raised drain region, and the second conductivity semiconductor device further comprises a second extension source region and a second extension drain region present in the semiconductor layer and in direct contact with the second raised source region and the second raised drain region.

15. The electrical device of claim 10, wherein at least one of the first conductivity semiconductor-containing resistor and the second conductivity semiconductor-containing resistor further comprise metal semiconductor alloy contacts on opposing sides of the upper surface of the single crystal semiconductor material, wherein the metal semiconductor alloy contacts are separated by a dielectric layer that is present on the upper surface of the single crystal semiconductor material.

16. The electrical device of claim 10, wherein the single crystal semiconductor material is a composition selected from the group consisting of silicon, silicon germanium, silicon doped with carbon (Si:C) and a combination thereof.

17. The electrical device of claim 10, wherein the semiconductor layer is a material selected from the group consisting of Si, strained Si, SiC, SiGe, SiGeC, Si alloys, Ge, Ge alloys, GaAs, InAs, InP, and a combination thereof.

18. The electrical device of claim 10, wherein the semiconductor layer has a thickness of less than 5 nm.

\* \* \* \* \*